United States Patent
Ramdani et al.

(10) Patent No.: US 6,709,989 B2
(45) Date of Patent: Mar. 23, 2004

(54) METHOD FOR FABRICATING A SEMICONDUCTOR STRUCTURE INCLUDING A METAL OXIDE INTERFACE WITH SILICON

(75) Inventors: Jamal Ramdani, Chandler, AZ (US); Ravindranath Droopad, Chandler, AZ (US); Zhiyi Yu, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/885,409

(22) Filed: Jun. 21, 2001

(65) Prior Publication Data

US 2002/0197881 A1 Dec. 26, 2002

(51) Int. Cl.[7] .................. H01L 21/00; H01L 21/20; H01L 21/44; H01L 21/31; C30B 23/00
(52) U.S. Cl. .................. 438/763; 438/3; 438/481; 438/607; 438/683; 438/763; 117/101; 117/105; 117/108
(58) Field of Search .................. 438/216, 483, 438/680, 683, 764, 3, 479, 480–481, 606–607, 763; 117/101, 105, 108

(56) References Cited

U.S. PATENT DOCUMENTS

| | | |
|---|---|---|
| 3,617,951 A | 11/1971 | Anderson |
| 3,670,213 A | 6/1972 | Nakawaga et al. |
| 3,766,370 A | 10/1973 | Walther |
| 3,802,967 A | 4/1974 | Ladany et al. |
| 3,914,137 A | 10/1975 | Huffman et al. |
| 3,935,031 A | 1/1976 | Adler |
| 4,006,989 A | 2/1977 | Andringa |
| 4,084,130 A | 4/1978 | Holton |
| 4,120,588 A | 10/1978 | Chaum |
| 4,146,297 A | 3/1979 | Alferness et al. |
| 4,174,422 A | 11/1979 | Matthews et al. |
| 4,177,094 A | 12/1979 | Kroon |

(List continued on next page.)

FOREIGN PATENT DOCUMENTS

| | | |
|---|---|---|
| DE | 196 07 107 | 8/1997 |
| DE | 197 12 496 | 10/1997 |
| DE | 100 17 137 | 10/2000 |
| EP | 0 250 171 | 12/1987 |
| EP | 0 300 499 | 1/1989 |
| EP | 0 309 270 | 3/1989 |
| EP | 0 331 338 | 9/1989 |
| EP | 0 331 467 | 9/1989 |
| EP | 0 342 937 | 11/1989 |
| EP | 0 412 002 | 2/1991 |
| EP | 0 455 526 | 6/1991 |

(List continued on next page.)

OTHER PUBLICATIONS

Nakagawara et al., Effects of Buffer Layers in Epitaxial Growth of SrTiO$_3$ Thin Film on Si(100), *J. Appl. Phys.*, 78(12), Dec. 15, 1995, pp. 7226–7230.

(List continued on next page.)

*Primary Examiner*—John F. Niebling
*Assistant Examiner*—Viktor Simkovic
(74) *Attorney, Agent, or Firm*—Oblon, Spivak, McClelland, Maier & Neustadt, P.C.

(57) ABSTRACT

A method of fabricating a semiconductor structure including the steps of:
  providing a silicon substrate having a surface;
  forming by atomic layer deposition a monocrystalline seed layer on the surface of the silicon substrate; and
  forming by atomic layer deposition one or more layers of a monocrystalline high dielectric constant oxide on the seed layer,
    where providing a substrate includes providing a substrate having formed thereon a silicon oxide, and wherein forming by atomic layer deposition a seed layer further includes depositing a layer of a metal oxide onto a surface of the silicon oxide, flushing the layer of metal oxide with an inert gas, and reacting the metal oxide and the silicon oxide to form a monocrystalline silicate.

6 Claims, 2 Drawing Sheets

U.S. PATENT DOCUMENTS

| | | |
|---|---|---|
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,594,000 A | 6/1986 | Falk et al. |
| 4,629,821 A | 12/1986 | Bronstein-Bonte et al. |
| 4,661,176 A | 4/1987 | Manasevit |
| 4,667,088 A | 5/1987 | Kramer |
| 4,667,212 A | 5/1987 | Nakamura |
| 4,681,982 A | 7/1987 | Yoshida |
| 4,695,120 A | 9/1987 | Holder |
| 4,748,485 A | 5/1988 | Vasudev |
| 4,756,007 A | 7/1988 | Qureshi et al. |
| 4,772,929 A | 9/1988 | Manchester |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,563 A | 7/1991 | Feit et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura et al. |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,852 A | 6/1992 | Chang et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,244,818 A | 9/1993 | Jokers et al. |
| 5,248,564 A | 9/1993 | Ramesh |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |
| 5,281,834 A | 1/1994 | Cambou et al. |
| 5,283,462 A | 2/1994 | Stengel |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |
| 5,312,765 A | 5/1994 | Kanber |
| 5,314,547 A | 5/1994 | Heremans et al. |
| 5,323,023 A | 6/1994 | Fork |
| 5,326,721 A | 7/1994 | Summerfelt |
| 5,334,556 A | 8/1994 | Guldi |
| 5,352,926 A | 10/1994 | Andrews |
| 5,356,509 A | 10/1994 | Terranova et al. |
| 5,356,831 A | 10/1994 | Calviello et al. |
| 5,357,122 A | 10/1994 | Okubora et al. |
| 5,358,925 A | 10/1994 | Neville Connell et al. |
| 5,362,972 A | 11/1994 | Yazawa et al. |
| 5,371,621 A | 12/1994 | Stevens |
| 5,371,734 A | 12/1994 | Fischer |
| 5,372,992 A | 12/1994 | Itozaki et al. |
| 5,373,166 A | 12/1994 | Buchan et al. |
| 5,391,515 A | 2/1995 | Kao et al. |

| | | | | | |
|---|---|---|---|---|---|
| 5,393,352 A | 2/1995 | Summerfelt | 5,585,167 A | 12/1996 | Satoh et al. |
| 5,394,489 A | 2/1995 | Koch | 5,585,288 A | 12/1996 | Davis et al. |
| 5,395,663 A | 3/1995 | Tabata et al. | 5,588,995 A | 12/1996 | Sheldon |
| 5,397,428 A | 3/1995 | Stoner et al. | 5,589,284 A | 12/1996 | Summerfelt et al. |
| 5,399,898 A | 3/1995 | Rostoker | 5,596,205 A | 1/1997 | Reedy et al. |
| 5,404,581 A | 4/1995 | Honjo | 5,596,214 A | 1/1997 | Endo |
| 5,405,802 A | 4/1995 | Yamagata et al. | 5,602,418 A | 2/1997 | Imai et al. |
| 5,406,202 A | 4/1995 | Mehrgardt et al. | 5,603,764 A | 2/1997 | Matsuda et al. |
| 5,410,622 A | 4/1995 | Okada et al. | 5,606,184 A | 2/1997 | Abrokwah et al. |
| 5,418,216 A | 5/1995 | Fork | 5,608,046 A | 3/1997 | Cook et al. |
| 5,418,389 A | 5/1995 | Watanabe | 5,610,744 A | 3/1997 | Ho et al. |
| 5,420,102 A | 5/1995 | Harshavardhan et al. | 5,614,739 A | 3/1997 | Abrokwah et al. |
| 5,427,988 A | 6/1995 | Sengupta et al. | 5,619,051 A | 4/1997 | Endo |
| 5,436,759 A | 7/1995 | Dijaili et al. | 5,621,227 A | 4/1997 | Joshi |
| 5,438,584 A | 8/1995 | Paoli et al. | 5,623,439 A | 4/1997 | Gotoh et al. |
| 5,441,577 A | 8/1995 | Sasaki et al. | 5,623,552 A | 4/1997 | Lane |
| 5,442,191 A | 8/1995 | Ma | 5,629,534 A | 5/1997 | Inuzuka et al. |
| 5,442,561 A | 8/1995 | Yoshizawa et al. | 5,633,724 A | 5/1997 | King et al. |
| 5,444,016 A | 8/1995 | Abrokwah et al. | 5,635,433 A | 6/1997 | Sengupta |
| 5,446,719 A | 8/1995 | Yoshida et al. | 5,635,453 A | 6/1997 | Pique et al. |
| 5,450,812 A | 9/1995 | McKee et al. | 5,640,267 A | 6/1997 | May et al. |
| 5,452,118 A | 9/1995 | Maruska | 5,650,646 A | 7/1997 | Summerfelt |
| 5,453,727 A | 9/1995 | Shibasaki et al. | 5,656,382 A | 8/1997 | Nashimoto |
| 5,466,631 A | 11/1995 | Ichikawa et al. | 5,659,180 A | 8/1997 | Shen et al. |
| 5,473,047 A | 12/1995 | Shi | 5,661,112 A | 8/1997 | Hatta et al. |
| 5,473,171 A | 12/1995 | Summerfelt | 5,666,376 A | 9/1997 | Cheng |
| 5,477,363 A | 12/1995 | Matsuda | 5,668,048 A | 9/1997 | Kondo et al. |
| 5,478,653 A | 12/1995 | Guenzer | 5,670,798 A | 9/1997 | Schetzina |
| 5,479,033 A | 12/1995 | Baca et al. | 5,670,800 A | 9/1997 | Nakao et al. |
| 5,479,317 A | 12/1995 | Ramesh | 5,674,366 A | 10/1997 | Hayashi et al. |
| 5,480,829 A | 1/1996 | Abrokwah et al. | 5,674,813 A | 10/1997 | Nakamura et al. |
| 5,481,102 A | 1/1996 | Hazelrigg, Jr. | 5,679,947 A | 10/1997 | Doi et al. |
| 5,482,003 A | 1/1996 | McKee et al. | 5,679,965 A | 10/1997 | Schetzina |
| 5,484,664 A | 1/1996 | Kitahara et al. | 5,682,046 A | 10/1997 | Takahashi et al. |
| 5,486,406 A | 1/1996 | Shi | 5,684,302 A | 11/1997 | Wersing et al. |
| 5,491,461 A | 2/1996 | Partin et al. | 5,686,741 A | 11/1997 | Ohori et al. |
| 5,492,859 A | 2/1996 | Sakaguchi et al. | 5,689,123 A | 11/1997 | Major et al. |
| 5,494,711 A | 2/1996 | Takeda et al. | 5,693,140 A | 12/1997 | McKee et al. |
| 5,504,035 A | 4/1996 | Rostoker et al. | 5,719,417 A | 2/1998 | Roeder et al. |
| 5,504,183 A | 4/1996 | Shi et al. | 5,725,641 A | 3/1998 | MacLeod |
| 5,508,554 A | 4/1996 | Takatani et al. | 5,729,394 A | 3/1998 | Sevier et al. |
| 5,510,665 A | 4/1996 | Conley | 5,729,641 A | 3/1998 | Chandonnet et al. |
| 5,511,238 A | 4/1996 | Bayraktaroglu | 5,731,220 A | 3/1998 | Tsu et al. |
| 5,512,773 A | 4/1996 | Wolf et al. | 5,733,641 A | 3/1998 | Fork et al. |
| 5,514,484 A | 5/1996 | Nashimoto | 5,734,672 A | 3/1998 | McMinn et al. |
| 5,514,904 A | 5/1996 | Onga et al. | 5,735,949 A | 4/1998 | Mantl et al. |
| 5,515,047 A | 5/1996 | Yamakido et al. | 5,741,724 A | 4/1998 | Ramdani et al. |
| 5,515,810 A | 5/1996 | Yamashita et al. | 5,745,631 A | 4/1998 | Reinker |
| 5,516,725 A | 5/1996 | Chang et al. | 5,753,300 A | 5/1998 | Wessels et al. |
| 5,519,235 A | 5/1996 | Ramesh | 5,753,928 A | 5/1998 | Krause |
| 5,528,057 A | 6/1996 | Yanagase et al. | 5,754,319 A | 5/1998 | Van De Voorde et al. |
| 5,528,067 A | 6/1996 | Farb | 5,760,426 A | 6/1998 | Marx et al. |
| 5,528,209 A | 6/1996 | Macdonald et al. | 5,760,427 A | 6/1998 | Onda |
| 5,528,414 A | 6/1996 | Oakley | 5,764,676 A | 6/1998 | Paoli et al. |
| 5,530,235 A | 6/1996 | Stefik et al. | 5,767,543 A | 6/1998 | Ooms et al. |
| 5,538,941 A | 7/1996 | Findikoglu et al. | 5,770,887 A | 6/1998 | Tadatomo et al. |
| 5,541,422 A | 7/1996 | Wolf et al. | 5,772,758 A | 6/1998 | Collins et al. |
| 5,549,977 A | 8/1996 | Jin et al. | 5,776,359 A | 7/1998 | Schultz et al. |
| 5,551,238 A | 9/1996 | Prueitt | 5,776,621 A | 7/1998 | Nashimoto |
| 5,552,547 A | 9/1996 | Shi | 5,777,350 A | 7/1998 | Nakamura et al. |
| 5,553,089 A | 9/1996 | Seki et al. | 5,777,762 A | 7/1998 | Yamamoto |
| 5,556,463 A | 9/1996 | Guenzer | 5,778,018 A | 7/1998 | Yoshikawa et al. |
| 5,559,368 A | 9/1996 | Hu et al. | 5,778,116 A | 7/1998 | Tomich |
| 5,561,305 A | 10/1996 | Smith | 5,780,311 A | 7/1998 | Beasom et al. |
| 5,569,953 A | 10/1996 | Kikkawa et al. | 5,789,733 A | 8/1998 | Jachimowicz et al. |
| 5,570,226 A | 10/1996 | Ota | 5,789,845 A | 8/1998 | Wadaka et al. |
| 5,572,052 A | 11/1996 | Kashihara et al. | 5,790,583 A | 8/1998 | Ho |
| 5,574,296 A | 11/1996 | Park et al. | 5,792,569 A | 8/1998 | Sun et al. |
| 5,574,589 A | 11/1996 | Feuer et al. | 5,792,679 A | 8/1998 | Nakato |
| 5,576,879 A | 11/1996 | Nashimoto | 5,796,648 A | 8/1998 | Kawakubo et al. |
| 5,578,162 A | 11/1996 | D'Asaro et al. | 5,801,072 A | 9/1998 | Barber |

| | | | | | | |
|---|---|---|---|---|---|---|
| 5,801,105 A | 9/1998 | Yano et al. | | 6,020,222 A | 2/2000 | Wollesen |
| 5,807,440 A | 9/1998 | Kubota et al. | | 6,022,140 A | 2/2000 | Fraden et al. |
| 5,810,923 A | 9/1998 | Yano et al. | | 6,022,410 A | 2/2000 | Yu et al. |
| 5,812,272 A | 9/1998 | King et al. | | 6,022,963 A | 2/2000 | McGall et al. |
| 5,814,583 A | 9/1998 | Itozaki et al. | | 6,023,082 A | 2/2000 | McKee et al. |
| 5,825,055 A | 10/1998 | Summerfelt | | 6,028,853 A | 2/2000 | Haartsen |
| 5,825,799 A | 10/1998 | Ho | | 6,039,803 A | 3/2000 | Fitzgerald et al. |
| 5,827,755 A | 10/1998 | Yonehara et al. | | 6,045,626 A | 4/2000 | Yano et al. |
| 5,828,080 A | 10/1998 | Yano et al. | | 6,046,464 A | 4/2000 | Schetzina |
| 5,830,270 A | 11/1998 | McKee et al. | | 6,048,751 A | 4/2000 | D'Asaro et al. |
| 5,831,960 A | 11/1998 | Jiang et al. | | 6,049,110 A | 4/2000 | Koh |
| 5,833,603 A | 11/1998 | Kovacs et al. | | 6,049,702 A | 4/2000 | Tham et al. |
| 5,834,362 A | 11/1998 | Miyagaki et al. | | 6,051,858 A | 4/2000 | Uchida et al. |
| 5,838,035 A | 11/1998 | Ramesh | | 6,055,179 A | 4/2000 | Koganei et al. |
| 5,838,053 A | 11/1998 | Bevan et al. | | 6,058,131 A | 5/2000 | Pan |
| 5,844,260 A | 12/1998 | Ohori | | 6,064,078 A | 5/2000 | Northrup et al. |
| 5,846,846 A | 12/1998 | Suh et al. | | 6,064,092 A | 5/2000 | Park |
| 5,852,687 A | 12/1998 | Wickham | | 6,064,783 A | 5/2000 | Congdon et al. |
| 5,857,049 A | 1/1999 | Beranek et al. | | 6,078,717 A | 6/2000 | Nashimoto et al. |
| 5,858,814 A | 1/1999 | Goossen et al. | | 6,080,378 A | 6/2000 | Yokota et al. |
| 5,861,966 A | 1/1999 | Ortel | | 6,083,697 A | 7/2000 | Beecher et al. |
| 5,863,326 A | 1/1999 | Nause et al. | | 6,087,681 A | 7/2000 | Shakuda |
| 5,864,171 A | 1/1999 | Yamamoto et al. | | 6,088,216 A | 7/2000 | Laibowitz et al. |
| 5,869,845 A | 2/1999 | Vander Wagt et al. | | 6,090,659 A | 7/2000 | Laibowitz et al. |
| 5,872,493 A | 2/1999 | Ella | | 6,093,302 A | 7/2000 | Montgomery |
| 5,873,977 A | 2/1999 | Desu et al. | | 6,096,584 A | 8/2000 | Ellis-Monaghan et al. |
| 5,874,860 A | 2/1999 | Brunel et al. | | 6,100,578 A | 8/2000 | Suzuki |
| 5,878,175 A | 3/1999 | Sonoda et al. | | 6,103,008 A | 8/2000 | McKee et al. |
| 5,879,956 A | 3/1999 | Seon et al. | | 6,103,403 A | 8/2000 | Grigorian et al. |
| 5,880,452 A | 3/1999 | Plesko | | 6,107,653 A | 8/2000 | Fitzgerald |
| 5,882,948 A | 3/1999 | Jewell | | 6,107,721 A | 8/2000 | Lakin |
| 5,883,564 A | 3/1999 | Partin | | 6,108,125 A | 8/2000 | Yano |
| 5,883,996 A | 3/1999 | Knapp et al. | | 6,110,813 A | 8/2000 | Ota et al. |
| 5,886,867 A | 3/1999 | Chivukula et al. | | 6,113,225 A | 9/2000 | Miyata et al. |
| 5,888,296 A | 3/1999 | Ooms et al. | | 6,113,690 A | 9/2000 | Yu et al. |
| 5,889,296 A | 3/1999 | Imamura et al. | | 6,114,996 A | 9/2000 | Nghiem |
| 5,896,476 A | 4/1999 | Wisseman et al. | | 6,121,642 A | 9/2000 | Newns |
| 5,905,571 A | 5/1999 | Butler et al. | | 6,121,647 A | 9/2000 | Yano et al. |
| 5,907,792 A | 5/1999 | Droopad et al. | | 6,124,158 A * | 9/2000 | Dautartas et al. ............ 438/216 |
| 5,912,068 A | 6/1999 | Jia | | 6,128,178 A | 10/2000 | Newns |
| 5,926,493 A | 7/1999 | O'Brien et al. | | 6,134,114 A | 10/2000 | Ungermann et al. |
| 5,926,496 A | 7/1999 | Ho et al. | | 6,136,666 A | 10/2000 | So |
| 5,937,115 A | 8/1999 | Domash | | 6,137,603 A | 10/2000 | Henmi |
| 5,937,274 A | 8/1999 | Kondow et al. | | 6,139,483 A | 10/2000 | Seabaugh et al. |
| 5,937,285 A | 8/1999 | Abrokwah et al. | | 6,143,072 A | 11/2000 | McKee et al. |
| 5,948,161 A | 9/1999 | Kizuki | | 6,143,366 A | 11/2000 | Lu |
| 5,953,468 A | 9/1999 | Finnila et al. | | 6,146,906 A | 11/2000 | Inoue et al. |
| 5,955,591 A | 9/1999 | Imbach et al. | | 6,150,239 A | 11/2000 | Goesele et al. |
| 5,959,308 A | 9/1999 | Shichijo et al. | | 6,153,010 A | 11/2000 | Kiyoku et al. |
| 5,959,879 A | 9/1999 | Koo | | 6,153,454 A | 11/2000 | Krivokapic |
| 5,962,069 A | 10/1999 | Schindler et al. | | 6,156,581 A | 12/2000 | Vaudo et al. |
| 5,963,291 A | 10/1999 | Wu et al. | | 6,173,474 B1 | 1/2001 | Conrad |
| 5,966,323 A | 10/1999 | Chen et al. | | 6,174,755 B1 | 1/2001 | Manning |
| 5,976,953 A | 11/1999 | Zavracky et al. | | 6,175,497 B1 | 1/2001 | Tseng et al. |
| 5,977,567 A | 11/1999 | Verdiell | | 6,175,555 B1 | 1/2001 | Hoole |
| 5,981,400 A | 11/1999 | Lo | | 6,180,252 B1 | 1/2001 | Farrell et al. |
| 5,981,976 A | 11/1999 | Murasato | | 6,180,486 B1 | 1/2001 | Leobandung et al. |
| 5,981,980 A | 11/1999 | Miyajima et al. | | 6,184,044 B1 | 2/2001 | Sone et al. |
| 5,984,190 A | 11/1999 | Nevill | | 6,184,144 B1 | 2/2001 | Lo |
| 5,987,011 A | 11/1999 | Toh | | 6,191,011 B1 | 2/2001 | Gilboa et al. |
| 5,987,196 A | 11/1999 | Noble | | 6,194,753 B1 | 2/2001 | Seon et al. |
| 5,990,495 A | 11/1999 | Ohba | | 6,197,503 B1 | 3/2001 | Vo-Dinh et al. |
| 5,995,359 A | 11/1999 | Klee et al. | | 6,198,119 B1 | 3/2001 | Nabatame et al. |
| 5,995,528 A | 11/1999 | Fukunaga et al. | | 6,200,893 B1 * | 3/2001 | Sneh ........................... 117/92 |
| 5,998,781 A | 12/1999 | Vawter et al. | | 6,204,737 B1 | 3/2001 | Ella |
| 5,998,819 A | 12/1999 | Yokoyama et al. | | 6,208,453 B1 | 3/2001 | Wessels et al. |
| 6,002,375 A | 12/1999 | Corman et al. | | 6,210,988 B1 | 4/2001 | Howe et al. |
| 6,008,762 A | 12/1999 | Nghiem | | 6,211,096 B1 | 4/2001 | Allman et al. |
| 6,011,641 A | 1/2000 | Shin et al. | | 6,222,654 B1 | 4/2001 | Frigo |
| 6,011,646 A | 1/2000 | Mirkarimi et al. | | 6,224,669 B1 | 5/2001 | Yi et al. |
| 6,013,553 A | 1/2000 | Wallace et al. | | 6,225,051 B1 | 5/2001 | Sugiyama et al. |

| | | | | | | |
|---|---|---|---|---|---|---|
| 6,229,159 B1 | 5/2001 | Suzuki | | 2002/0006245 A1 | 1/2002 | Kubota et al. |
| 6,232,910 B1 | 5/2001 | Bell et al. | | 2002/0008234 A1 | 1/2002 | Emrick |
| 6,235,145 B1 | 5/2001 | Li et al. | | 2002/0030246 A1 | 3/2002 | Eisenbeiser et al. |
| 6,235,649 B1 | 5/2001 | Kawahara et al. | | 2002/0047123 A1 | 4/2002 | Ramdani et al. |
| 6,238,945 B1 | 5/2001 | Kaneko | | 2002/0047143 A1 | 4/2002 | Ramdani et al. |
| 6,239,012 B1 | 5/2001 | Kinsman | | 2002/0072245 A1 | 6/2002 | Ooms et al. |
| 6,239,449 B1 | 5/2001 | Fafard et al. | | 2002/0079576 A1 | 6/2002 | Seshan |
| 6,241,821 B1 | 6/2001 | Yu et al. | | 2002/0131675 A1 | 9/2002 | Litvin |
| 6,242,686 B1 | 6/2001 | Kishimoto et al. | | 2002/0140012 A1 | 10/2002 | Droopad |
| 6,248,459 B1 | 6/2001 | Wang et al. | | 2002/0145168 A1 * | 10/2002 | Bojarczuk et al. ............ 21/31 |
| 6,248,621 B1 | 6/2001 | Wilk et al. | | 2002/0195610 A1 | 12/2002 | Klosowiak |
| 6,252,261 B1 | 6/2001 | Usui et al. | | | | |
| 6,255,198 B1 | 7/2001 | Linthicum et al. | | FOREIGN PATENT DOCUMENTS | | |
| 6,256,426 B1 | 7/2001 | Duchet | | EP | 0 483 993 | 5/1992 |
| 6,265,749 B1 | 7/2001 | Gardner et al. | | EP | 0 514 018 | 11/1992 |
| 6,268,269 B1 | 7/2001 | Lee et al. | | EP | 0 538 611 | 4/1993 |
| 6,271,619 B1 | 8/2001 | Yamada et al. | | EP | 0 581 239 | 2/1994 |
| 6,275,122 B1 | 8/2001 | Speidell et al. | | EP | 0 600 658 | 6/1994 |
| 6,277,436 B1 | 8/2001 | Stauf et al. | | EP | 0 602 568 | 6/1994 |
| 6,278,137 B1 | 8/2001 | Shimoyama et al. | | EP | 0 607 435 | 7/1994 |
| 6,278,138 B1 | 8/2001 | Suzuki | | EP | 0 614 256 | 9/1994 |
| 6,278,523 B1 | 8/2001 | Gorecki | | EP | 0 619 283 | 10/1994 |
| 6,291,319 B1 * | 9/2001 | Yu et al. .................. 117/109 | | EP | 0 630 057 | 12/1994 |
| 6,297,598 B1 | 10/2001 | Wang et al. | | EP | 0 661 561 | 7/1995 |
| 6,297,842 B1 | 10/2001 | Koizumi et al. | | EP | 0 860 913 | 8/1995 |
| 6,300,615 B1 | 10/2001 | Shinohara et al. | | EP | 0 682 266 | 11/1995 |
| 6,306,668 B1 | 10/2001 | McKee et al. | | EP | 0 711 853 | 5/1996 |
| 6,307,996 B1 | 10/2001 | Nashimoto et al. | | EP | 0 875 922 | 11/1996 |
| 6,312,819 B1 | 11/2001 | Jia et al. | | EP | 0 777 379 | 6/1997 |
| 6,313,486 B1 | 11/2001 | Kencke et al. | | EP | 0 810 666 | 12/1997 |
| 6,316,785 B1 | 11/2001 | Nunoue et al. | | EP | 0 852 416 | 7/1998 |
| 6,316,832 B1 | 11/2001 | Tsuzuki et al. | | EP | 0 881 669 | 12/1998 |
| 6,319,730 B1 * | 11/2001 | Ramdani et al. ............... 438/3 | | EP | 0 884 757 | 12/1998 |
| 6,320,238 B1 | 11/2001 | Kizilyalli et al. | | EP | 0 926 739 | 6/1999 |
| 6,326,637 B1 | 12/2001 | Parkin et al. | | EP | 0 957 522 | 11/1999 |
| 6,326,645 B1 | 12/2001 | Kadota | | EP | 0 964 259 | 12/1999 |
| 6,338,756 B2 | 1/2002 | Dietze | | EP | 0 964 453 | 12/1999 |
| 6,339,664 B1 | 1/2002 | Farjady et al. | | EP | 0 993 027 | 4/2000 |
| 6,340,788 B1 | 1/2002 | King et al. | | EP | 0 999 600 | 5/2000 |
| 6,343,171 B1 | 1/2002 | Yoshimura et al. | | EP | 1 001 468 | 5/2000 |
| 6,345,424 B1 | 2/2002 | Hasegawa et al. | | EP | 1 035 759 | 9/2000 |
| 6,346,477 B1 * | 2/2002 | Kaloyeros et al. ......... 438/680 | | EP | 1 043 426 | 10/2000 |
| 6,348,373 B1 | 2/2002 | Ma et al. | | EP | 1 043 765 | 10/2000 |
| 6,359,330 B1 | 3/2002 | Goudard | | EP | 1 054 442 | 11/2000 |
| 6,362,017 B1 | 3/2002 | Manabe et al. | | EP | 1 069 606 | 1/2001 |
| 6,367,699 B2 | 4/2002 | Ackley | | EP | 1 085 319 | 3/2001 |
| 6,372,356 B1 | 4/2002 | Thornton et al. | | EP | 1 089 338 | 4/2001 |
| 6,372,813 B1 | 4/2002 | Johnson et al. | | EP | 1 109 212 | 6/2001 |
| 6,376,337 B1 | 4/2002 | Wang et al. | | FR | 2 779 843 | 12/1999 |
| 6,389,209 B1 | 5/2002 | Suhir | | GB | 1 319 311 | 6/1970 |
| 6,391,674 B2 | 5/2002 | Ziegler | | GB | 2 335 792 | 9/1999 |
| 6,392,253 B1 | 5/2002 | Saxena | | JP | 52-88354 | 7/1977 |
| 6,392,257 B1 | 5/2002 | Ramdani et al. | | JP | 52-89070 | 7/1977 |
| 6,393,167 B1 | 5/2002 | Davis et al. | | JP | 52-135684 | 11/1977 |
| 6,404,027 B1 | 6/2002 | Hong et al. | | JP | 54-134554 | 10/1979 |
| 6,410,941 B1 | 6/2002 | Taylor et al. | | JP | 55-87424 | 7/1980 |
| 6,410,947 B1 | 6/2002 | Wada | | JP | 58-075868 | 5/1983 |
| 6,411,756 B2 | 6/2002 | Sadot et al. | | JP | 58-213412 | 12/1983 |
| 6,417,059 B2 | 7/2002 | Huang | | JP | 60-210018 | 10/1985 |
| 6,427,066 B1 | 7/2002 | Grube | | JP | 60-212018 | 10/1985 |
| 6,432,546 B1 | 8/2002 | Ramesh et al. | | JP | 61-36981 | 2/1986 |
| 6,438,281 B1 | 8/2002 | Tsukamoto et al. | | JP | 61-63015 | 4/1986 |
| 6,452,232 B1 | 9/2002 | Adan | | JP | 61-108187 | 5/1986 |
| 6,461,927 B1 | 10/2002 | Mochizuki et al. | | JP | 62-245205 | 10/1987 |
| 6,462,360 B1 | 10/2002 | Higgins, Jr. et al. | | JP | 63-34994 | 2/1988 |
| 6,477,285 B1 | 11/2002 | Shanley | | JP | 63-131104 | 6/1988 |
| 6,496,469 B1 | 12/2002 | Uchizaki | | JP | 63-198365 | 8/1988 |
| 6,504,189 B1 | 1/2003 | Matsuda et al. | | JP | 63-289812 | 11/1988 |
| 2001/0013313 A1 | 8/2001 | Droopad et al. | | JP | 64-50575 | 2/1989 |
| 2001/0020278 A1 | 9/2001 | Saito | | JP | 64-52329 | 2/1989 |
| 2001/0036142 A1 | 11/2001 | Kadowaki et al. | | JP | 1-102435 | 4/1989 |

| | | |
|---|---|---|
| JP | 1-179411 | 7/1989 |
| JP | 01-196809 | 8/1989 |
| JP | 03-149882 | 11/1989 |
| JP | HEI 2-391 | 1/1990 |
| JP | 02051220 | 2/1990 |
| JP | 3-41783 | 2/1991 |
| JP | 3-171617 | 7/1991 |
| JP | 03-188619 | 8/1991 |
| JP | 5-48072 | 2/1993 |
| JP | 5-086477 | 4/1993 |
| JP | 05150143 | 6/1993 |
| JP | 5-152529 | 6/1993 |
| JP | 05 221800 | 8/1993 |
| JP | 5-232307 | 9/1993 |
| JP | 5-243525 | 9/1993 |
| JP | 05243525 A * | 9/1993 |
| JP | 5-291299 | 11/1993 |
| JP | 06-069490 | 3/1994 |
| JP | 6-232126 | 8/1994 |
| JP | 6-291299 | 10/1994 |
| JP | 6-334168 | 12/1994 |
| JP | 0812494 | 1/1996 |
| JP | 10-256154 | 9/1996 |
| JP | 9-67193 | 3/1997 |
| JP | 9-82913 | 3/1997 |
| JP | 10-303396 | 11/1998 |
| JP | 10-321943 | 12/1998 |
| JP | 11135614 | 5/1999 |
| JP | 11-238683 | 8/1999 |
| JP | 11-260835 | 9/1999 |
| JP | 01 294594 | 11/1999 |
| JP | 11340542 | 12/1999 |
| JP | 2000-068466 | 3/2000 |
| JP | 2 000 1645 | 6/2000 |
| JP | 2000-349278 | 12/2000 |
| JP | 2000-351692 | 12/2000 |
| JP | 2002-9366 | 1/2002 |
| WO | WO 92/10875 | 6/1992 |
| WO | WO 93/7647 | 4/1993 |
| WO | WO 94/03908 | 2/1994 |
| WO | WO 97/45827 | 12/1997 |
| WO | WO 98/05807 | 1/1998 |
| WO | WO 98/20606 | 5/1998 |
| WO | WO 99/14797 | 3/1999 |
| WO | WO 99/14804 | 3/1999 |
| WO | WO 99/19546 | 4/1999 |
| WO | WO 99/63580 | 12/1999 |
| WO | WO 00/06812 | 2/2000 |
| WO | WO 00/16378 | 3/2000 |
| WO | WO 00/33363 | 6/2000 |
| WO | WO 00/48239 | 8/2000 |
| WO | WO 01/04943 A1 | 1/2001 |
| WO | WO 01/16395 | 3/2001 |
| WO | WO 01/33585 | 5/2001 |
| WO | WO 01/37330 | 5/2001 |
| WO | WO 01/59814 A2 | 8/2001 |
| WO | WO 01/59820 A1 | 8/2001 |
| WO | WO 01/59821 A1 | 8/2001 |
| WO | WO 01/59837 | 8/2001 |
| WO | WO 02 01648 | 1/2002 |
| WO | WO 02/03113 | 1/2002 |
| WO | WO 02/03467 | 1/2002 |
| WO | WO 02/03480 | 1/2002 |
| WO | WO 02/08806 | 1/2002 |
| WO | WO 02/09160 A2 | 1/2002 |
| WO | WO 02/33385 A2 | 4/2002 |
| WO | WO 02/47127 A2 | 6/2002 |
| WO | WO 02/50879 | 6/2002 |

OTHER PUBLICATIONS

Suzuki et al., "A Proposal of Epitaxial Oxide Thin Film Structures For Future Oxide Electronics," *Materials Science and Engineering B41*, (1996), pp. 166–173.

W. F. Egelhoff et al., "Optimizing GMR Spin Valves: The Outlook for Improved Properties", *1998 Intl Non Volatile Memory Technology Conference*, pp. 34–37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric interactions in GaAs/LiNbO$_3$ Structures", *Applied Physics Letters*, vol. 75(7), Aug. 15, 1999, pp. 965–967.

K. Sreenivas et al., "Surface Acoustic Wave Propagation on Lead Zirconate Titanate Thin Films," *Appl. Phys. Lett.* 52 (9), Feb. 29, 1998, pp. 709–711.

M. Rotter et al., "Single Chip Fused Hybrids for Acousto–Electric and Acousto–Optic Applications," *1997 Applied Physics Letters*, vol. 70(16), Apr. 21, 1997, pp. 2097–2099.

A. Mansingh et al., "Surface Acoustic Wave Propagation in PZT/YBCO/SrTiO$_3$ and PbTiO$_3$/YBCO/SrTiO$_3$ Epitaxial Heterostructures," *Ferroelectric*, vol. 224, pp. 275–282, 1999.

S. Mathews et al., "Ferroelectric Field Effect Transistor Based on Epitaxial Perovskite Heterostructures", Science, vol. 276, Apr. 11, 1997, pp. 238–240.

R. Houdre et al., "Properties of GaAs on Sl Grown by Molecular Beam Epitaxy," *Solid State and Materials Sciences*, vol. 16, Issue 2, 1990, pp. 91–114.

S. F. Fang et al., "Gallium Arsenide and Other Compound Semiconductors on Silicon," *J. Appl. Phys.*, 68(7), Oct. 1, 1990, pp. R31–R58.

Carlin et al., Impact of GaAs Buffer Thickness on Electronic Quality of GaAs Grown on Graded Ge/GeSi/Sl Substrates, *Appl. Phys. Letter*, vol. 76, No. 14, Apr. 2000, pp. 1884–1886.

Ringel et al., "Epitaxial Integration of III–V Materials and Devices with Si Using Graded GeSi Buffers," 27th International Symposium on Compound Semiconductors, Oct. 2000.

Zogg et al., "Progress in Compound–Semiconductor–on–Silicon–Heteroepitaxy with Fluoride Buffer Layers," *J. Electrochem Soc.*, vol. 136, No. 3, Mar. 1998, pp. 775–779.

Gong et al., "Oxide Defined GaAs Vertical–Cavity Surface–Emitting Lasers on Si Substrates," *IEEE Photonics Technology Letters*, vol. 12, No. 2, Feb. 2000, pp. 110–112.

Clem et al., "Investigation of PZT//LSCO//Pt//Aerogel Thin Film Composites for Uncooled Pyroelectric IR Detectors," *Met. Res. Soc. Symp. Proc.*, vol. 541, pp. 661–666, 1999.

Gunapata et al., "Bound–To–Quasl–Bound Quantum–Well Infrared Photodetectors," NASA Tech Brief, vol. 22, No. 9, Sep. 1998.

Abhay M. Joshi et al., "Monolithic InGaAs–on–silicon Wave Infrared Detector Arrays," *Intn. Society for Optical Engineering*, vol. 2999, pp. 211–224.

Bruley et al., "Nanostructure and Chemistry of a (100) MgO/(100) GaAs Interface," *Appl. Phys Lett*, 65(5), Aug. 1994, pp. 564–566.

Fork et al., "Epitaxial MgO On Si(001) for Y–Ba–Cu–O Thin Film Growth by Pulsed Laser Deposition," *Appl. Phys Lett.*, 58(20), May 20, 1991, pp. 2294–2296.

Himpsel et al., "Dialectrics on Semiconductors," *Materials Science and Engineering*, B1(1988), pp. 9–13.

Li et al., "Epitaxial La$_{0.67}$Sr$_{0.33}$MnO$_3$ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters*, vol. 76, No. 14, Apr. 3, 2000, pp. 1914–1916.

Mikami et al., "Formation of Si Epi/MgO–Al$_2$O$_2$Epi./SiO$_3$/Si and Its Epitaxial Film Quality," Fundamental Research Laboratories and Microelectronics Laboratories, pp. 31–34, 1983.

T. Asano et al., "An Epitaxial Si/Insulator/Sl Structure Prepared by Vacuum Deposition of CaF$_2$ and Silicon," *Thin Solid Films*, vol. 93 (1982), pp. 143–150.

T. Chikyow et al., "Reaction and Regrowth Control of CeO$_2$ on Si(111) Surface for the Silicon–On–Insulator Structure," *Appl. Phys. Lett.*, vol. 55, No. 8, Aug. 22, 1994, pp. 1030–1032.

J.F. Kang, et al., "Epitaxial Growth of CeO$_2$(100) Films on Si(100) Substrate by Dual Ion Beams Reactive Sputtering," *Solid State Communications*, vol. 108, No. 4, pp. 225–227, 1998.

R.A. Morgan et al., "Vertical–Cavity Surface–Emitting Lasers Come of Age." *SPIE*, vol. 2683, pp. 18–29.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

Jo–Ey Wong, et al.; "An Electrostatically–Actuated Mems Switch For Power Applications"; IEEE, 2000; pp. 633–638.

T. Mizuno, et al.; "Electron and Hole Mobility Enhancement in Strained–Si MOSFET's on SlGe–on–Insulator Substrates Fabricated by SIMOX Technology"; IEEE Electron Device Letters, vol. 21, No. 5, May 2000; pp. 230–232.

F.M. Buffer, et al.; "Strain–dependence of electron transport in bulk Si and deep–submicron MOSFET's" Computatural Electronics, 2000, Book of Abstracts, IWCE Glasgow 2000, 7$^{th}$ Int'l Workshop on, 2000; pp. 64–65.

S.S. Lu. et al.; "Pielectric field effect transistor (PEFET) using In$_{0.2}$Ga$_{0.8}$As/Al$_{0.35}$Ga$_{0.65}$As/In$_{0.2}$Ga$_{0.8}$As/GaAs Strained layer structure on (111)B GaAs Substrate"; Electronics Letters, 12$^{TM}$ Ma 1994, vol. 30, No. 10; pp. 823–825.

Kihong Kim, et al."On–Chip Wireless Interconnection with Integrated Antennas"; 2000 IEEE; pp. 20.2.1–20.3.4.

G. Passiopoulos, et al.; "V–Band Single Chip, Direct Carrier BPSK Modulation Transmitter With Integrated Patch Antenna"; 1998 IEEE MTT–S Digest; pp. 305–308.

Mau–Chung Frank Chang, et al.; "RF/Wireless Interconnect for Inter– and Intra–Chip Communications"; Proceedings of the IEEE, vol. 89, No. 4, Apr. 2001; pp. 456–466.

The Electronic Industry Report; Prismark; 2001; pp. 111–120.

J.K. Abrokwah, et al.; "A Manufacturable Complementary GaAs Process"; GaAs IC Symposium, IEEE, 1993; pp. 127–130.

H. Nagata, "A Preliminary Consideration of the Growth Behaviour of CeO$_2$, SrTiO$_3$ and SrVO$_3$ Films on Si Substrate," *Thin Solid Films*, 224, 1993, pp. 1–3.

Nagata et al., "Heteroepixaxial Growth of CeO$_2$(001) Films on Si(001) Substrates by Pulsed Laser Deposition in Ultrahigh Vacuum," *Jpn. Jour. Appl. Phys.*, vol. 30, No. 6B, Jun. 1991, pp. L1136–L1138.

Kado et al., "Heleroepitaxial Growth of SrO Films on Si Substrates," *J. Appl. Phys.*, 61(6), Mar. 15, 1987, pp. 2398–2400.

H. Ishiwara et al., "Epitaxial Growth of Perovskite Type Oxide Films on Substrates"; *Materials Research Symposium Proceedings*, vol. 220, pp. 595–600, Apr. 29—May 3, 1991.

J.K. Abrokwah, et al.; "A Manufacturable High–Speed Low– Power Complementary GaAs Process"; Extended Abstracts of the 1994 International Conference on Solid Devices and Materials, Yokohama, 1994, pp. 592–594.

C.J. Palmslrom et al.; "Stable and Epitaxial Contacts to III–V Compound Semiconductors"; Contacts to Semiconductors Fundamentals and Technology: Noyles Publications, 1993; pp. 67–150.

Jayshri Sabarinathat, et al.; "Submicron three–dimensional infrared GaAs/Al$_x$O$_y$–based photonic crystal using single–step epitaxial growth"; Applied Physics Letters. vol. 78, No. 20, May 14, 2001; pp. 3024–3026.

Philip Ball; "The Next Generation of Optical Fibers"; Technology Review. May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51–96.

G. H. Jin, et al.; "PLZT Film Waveguide Mach–Zehnder Electrooptic Modulator"; Journal of Lightwave Technology, vol. 18, No. 5. Jun. 2000; pp. 807–812.

D.E. Aspnes, et al.; "Steps on (001) silicon surfaces"; J. Vac Sci. Technol. B, vol. 5, No. 4, Jul./Aug. 1987; pp. 939–944.

D.M. Newns, et al.; "Mott transilion field effect transistor"; Applied Physics Letters, vol. 73, No. 6, Aug. 10, 1998, pp. 780–782.

Lucent Technologies, Inc. "Arrayed Waveguide Grating Multiplexer/Demultiplexer"; Jan. 2000; 4 pages.

Hisashi Schichijo, et al.; "Co–Integration of GaAs MESFET and Si CMOS Circuits"; IEEE Electron Device Letters, vol. 9, No. 9, Sep. 1988; pp. 444–446.

H. Shichijo, et al.: "GaAs MESFET and Si CMOS Cointegration and Circuit Techniques"; 1988 IEEE; GaAs IC Symposium 239–242.

H. Shichijo, et al.: "Monolithic Process for Co–Integration of GaAs and Sllicon Circuits"; 1988 IEEE; pp. 778–781.

Z.H. Zhu, et al. "Growth of InGaAs multi–quantum wells at 1.3 m wavelength on GaAs compliant substrates"; Applied Physics Letters, vol. 72, No. 20, May 18, 1998; pp. 2598–2600.

Kurt Eisenbeiser, et al.; "Metamorphic InAlAs/InGaAs Enchancement Mode HEMT's on GaAs Substrates"; IEEE Electron Device Letters, vol. 20, No. 10, Oct. 1999; pp. 507–509.

Tomonori NAGASHIMA, et al.; "Three–Terminal Tandem Solar Cells With a Back–Contact Type Bottom Cell " Higashifuji Technical Center, Toyota Motor Corporation; 4 pages.

James Schellenberg, et al.; "Low–Loss, Planar Monolithic Baluns for K/Ka–Band Applications"; 1999 IEEE MTT–s Digestp pp. 1733–1736.

Arnold Leitner et al; "Pulsed Laser Deposition of Superconducting Strontium Titanate Thin–Films"; ; Session K11–Thin Films and Borocarbides; Mixed Session, Wednesday Afternoon; Mar. 19 1997; Room 1202 B, Conv. Center (Abstract).

R.D. Vispute; "High quality optoelectronic grade apitaxial AlN films on -Al$_2$O$_3$, Si and 6H–SiC by pulsed laser deposition"; Thin Solid Films 299 (1997), pp. 94–103.

T. Warren Weeks, et al.; "GaN thin films deposited via organometallic vapor phase epitaxy on (6H)–SiC(0001) using high–temperature monocrystalline AlN buffer layers" 320 Applied Physics Letters, vol. 67, No. 3, Jul. 17, 1995, pp 1401–1403.

Z. Yu, et al.; "Epitaxial oxide thin films on Sl(001)"; J. Vac. Sci. Technol. B. vol. 18, No. 4, Jul./Aug. 2000; pp. 2139–2145.

Gentex Corporate Website; Photoelectric Smoke Detectors—How They Work; 2001.

Jeffrey B. Casady, et al.; "A Hybrid 6H–SiC Temperature Sensor Operational from 25 C to 500 C"; IEEE Transactions On Components, Packaging, And Manufacturing Technology—Part A, vol. 19, No. 3, Sep. 1996; pp. 416–422.

Ronald W. Waynant, et al.; "Optoelectronic Integrated Circuits"; Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D.A. Francis, et al.; "A single–chip linear optical amplifier"; OFC, 2001; Mar. 17–22, 2001.

G. Vogg et al.; "Epitaxial alloy films of zintl–phase Ca(Si1–xGex)2", Journal of Crystal Growth 223 (2001); pp. 573–576.

Peter S. Guilfoyle, et al.; "Optoelectronic Architecture for High–Speed Switching and Processing Applications"; 1998 The Photonics Design and Applications Handbook; pp. H–399–H–406.

Gerald B. Stringfellow; "Organometallic Vapor–Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer–Verlag Berlin Heidelberg, 1989, 1996.

"Integration of GaAs on Si Using a Spinel Buffer Layer", IBM Technical Bulletin, vol. 30, No. 6, Nov. 1987, p. 365.

"GainAs Superconducting FET," IBM Technical Bulletin, vol. 36, No. 8, Aug. 1993, p. 655–656.

"Epitaxial 3d Structure Using Mixed Spinels," IBM Technical Bulletin vol. 30, No. 3, Aug. 1987, p. 1271.

Moon et al., "Roles of Buffer Layers in Epitaxial Growth of SrTiO$_3$ Films on Silicon Substrates," *Japan J of Appl. Phys.*, vol. 33, Mar. 1994, pp. 1472–1477.

Yodo et al., GaAs Heteroepitaxial Growth on Sl Substrates with Thin Si Interlayers in situ Annealed at High Temperatures, 8257b *Journal of Vacuum Science & Technology*, 1995 May/Jun., vol. 13, No. 3, pp. 1000–1005.

Cuomo et al., "Substrate Effect on the Superconductivity of YBa$_2$Cu$_3$O$_7$ Thin Films," AIP Conference 1988, pp. 141–148.

McKee et al., "Crystalline Oxides on Silicon: The First Five Monolayers," *Physical Review Letters*, vol. 81, No. 14, Oct. 1998, pp. 3014–3017.

McKee et al., "Molecular Beam Epitaxy Growth of Epitaxial Barium Silicide, Barium Oxide, and Barium Titanate on Silicon," *1991 American Institute of Physics*, pp. 782–784, Aug. 13, 1991.

Tambo et al., Molecular Beam Epitaxy Growth of SrTiO$_3$ Films on Sl(100)–2x1 with SrO Buffer Layer, *Jpn. J. Appl. Phys.*, vol. 37, 1996, pp. 4454–4459.

McKee et al., "The MBE Growth and Optical Quality of BaTiO$_3$ and SrTiO$_3$ Thin Films on MgO," *Mat. Res. Soc. Symp. Proc.*, vol. 341, Apr. 1994, pp. 309–314.

McKee et al., "BaSi$_2$ and Thin Film Alkaline Earth Silicides," *Appl. Phys. Lett.*, 63 (20), Nov. 1993, pp. 2818–2820.

McKee et al., "Surface Structures and the Orthorhombic Transformation of Thin Film BaSi$_2$ on Silicon," *Mat. Res. Soc. Symp. Proc.*, vol. 221, pp. 131–136.

Brain A. Floyd, et al.; "The projected Power Consumption of a Wireless Clock Distribution System and Comparison to Conventional Distribution Systems"; IEEE, 1999; pp. IITC99–249–IITC99–250.

Mori et al., "Epitaxial Growth of SrTiO$_3$ Films on Si(100) Substrates Using a Focused Electron Beam Evaporation Method," *Jpn. J. of Apl. Phys.*, vol. 30, No. 8A, Aug. 1991, pp. L1415–L1417.

Moon et al., "Growth of Crystalline SrTiO$_3$ Films on Si Substrates Using Thin Fluoride Buffer Layers and Their Electrical Properties," *Jpn. J. of Appl. Phys.*, vol. 33, (1994), pp. 5911–5916.

Farrow et al., "Heteroepitaxy of Dissimilar Materials," *Mat. Res. Soc. Symposium Proceedings*, vol. 221, pp. 29–34, Apr. 29—May 2, 1991.

Ishiwara et al., "Heteroepitaxy of Silicon: Fundamentals, Structure, and Devices," *Mat. Res. Soc.*, Symposium Proceedings, vol. 116, pp. 369–374, Apr. 5–8, 1988.

Douglas B. Chrisey, et al; Pulsed Laser Deposition of Thin Films; pp. 273–285.

B.A. Block, et al; "Photoluminescence properties of Er$^3$–doped BaTiO$_3$ thin films"; Appl. Phys. Lett. 65 (1), Jul. 4, 1994, pp. 25–27.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy of GaAs on Si–on–Insulator"; 320 Applied Physics Letters 59(1991) Jul. 8 No. 2; pp. 210–212.

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J.M. Daughlon et al.; "Application of Spin Dependent Transport Materials"; J. Phys. D. Appl. Phys. 32(1999) R169–R177.

Wei Zhang et al.; "Stress Effect and Enhanced Magnetoresistance in La$_{0.67}$Ca$_{0.33}$MnO$_{3-\delta}$ Films"; Physical Review, B. Condensed Matter; American Institute of Physics; vol. 58, No. 21, Part 1; Dec. 1, 1998; pp. 14143–14146.

Q.-Y. Tong et al.; "IOS–anew type of materials combination for system–on–a chip preparation"; 1999 IEEE International SOI Conference, Oct. 1999; pp. 104–105.

T. Kanniainen et al.; "Growth of Dielectric 1hlo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Myung Bok Lee; "Heteroepitaxial Growth of BaTio$_3$ Films on Si by Pulsed Laser Deposition"; Applied Physics Letters; Mar. 13, 1995; pp. 1331–1333.

Myung Bok Lee; "Formation and Characterization of Epitaxial $TiO_2$ and $BaTiO_3/TiO_2$ Films on Si Substrate"; Japan Journal Applied Physics Letters; vol. 34; 1995; pp. 808–811.

Gilbert Lecarpentier et al.; "High Accuracy Machine Automated Assembly for Opto Electronics"; 2000 Electronic Components and Technology Conference; pp. 1–4.

R. Ramesh; "Ferroelectric La–Sr–Co–O/Pb–Zr–Ti–O/La–Sr–Co–O Heterostructures on Silicon via Template Growth"; 320 Applied Physics Letters; 63(1993); Dec. 27; No. 26; pp. 3592–3594.

K. Eisenbeiser; "Field Effect Transistors with $SrTiO_3$ Gate Dielectric on Si"; Applied Physics Letters; vol. 76, No. 10; Mar. 6, 200; pp. 1324–1326.

Stephen A. Mass; "Microwave Mixers"; Second Edition; 2pp.

Douglas J. Hamilton er al.; "Basic Integrated Circuit Engineering"; pp. 2; 1975.

Takeshi Obata; "Tunneling Magnetorestitance at Up to 270 K in $La_{0.8}Sr_{0.2}MnO_3/SrTiO_3/La_{0.8}Sr_{0.2}MnO_3$ Junctions with 1.6–nm–Thick Barriers"; Applied Physics Letters; vol. 74, No. 2; Jan. 11, 1999; pp. 290–292.

Wel Zhang et al.; "Enhanced Magnetoresistance in La–Ca–Mn–O Films on Si Substrates Using $YbaCuO/CeO_2$ Heterostructures"; *Physica C*: vol. 282–287, No. 2003; Aug. 1, 1997; pp. 1231–1232.

Shogo Imada et al; "Epitaxial Growth of Ferroelectridc $YmnO_3$ Thin Films on Si (111) Substrates by Molecular Beam Epitaxy"; Jpn. J. Appl. Phys. vol. 37 (1998); pp. 6497–6501; Part 1, No. 12A, Dec. 1998.

Ladislav Pust et al.; "Temperture Dependence of the Magnetization Reversal in Co(fcc)–BN–Co(poly hcp) Structures"; Journal of Applied Physics; vol. 85, No. 8; Apr. 15, 1999; pp. 5765–5767.

C. Martinez; "Epitaxial Metallic Nanostructures on GaAs"; Surface Science; vol. 482–485; pp. 910–915; 2001.

Wen–Ching Shih et al.; "Theoretical Investigation of the SAW Properties of Ferroelectric Film Composite Structures"; IEEE Transaction of Ultrasonics, Ferroelectrics, and Frequency Control; vol. 45, No. 2; Mar. 1998; pp. 305–316.

Zhu Dazhong et al.; "Design of $ZnO/SiO_2/Si$ Monolithic Integrated Programmable SAW Filter"; Proceedings of Fifth International Conference on Solid–State and Integrated Circuit Technology; 21–23; Oct. 1998; pp. 826–829.

Kirk–Othmer Encyclopedia of Chemical Technology; Fourth Edition, vol. 12; Fuel Resources to Heat Stabilizers; A Wiley–Interscience Publication: John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration Of InGaAs/InAlAs MODFETs and RTDs on inP–bonded–to Si SUBSTRATE"; Fourth International Conference on indium Phosphide and Related Materials, Newport, RI, USA; Apr. 21–24, 1992 ; pp. 167–170; XP000341253; IEEE, New York, NY, USA; ISBN; 0–7803–0522–1.

H. Takahashi et al.; "Arrayed–Waveguide Grating For Wavelength Division Multi/Demultiplexer With Nanometre Resolution"; Electronics Letters; vol. 28, No. 2, Jan. 18, 1990.

Pierret, R.F.; "1/J–FET and MESFET"; Field Effect Devices; MA, Addison–Wesley; 1990; pp. 9–22.

M. Schreiter, et al.; "Sputtering of Self–Polarized PZT Films for IR–Detector Arrays"; 1998 IEEE; pp. 181–185.

Hideaki Adachi et al., "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366–369.

P.A. Langiahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.

Wang et al.; "Depletion–Mode GaAs MOSFETs with Negligible Drain Current Drift and Hysterasis"; Electron Devices Meeting, 1998, IEDM '98 Technical Digest; pp. 67–70.

Ben G. Streetman; "Solid State Electronic Devices"; 1990, Prentice Hall; Third Edition; pp. 320–322.

A.Y Wu et al.; "Highly Oriented $(Pb,La)(ZR,Ti)O_3$ Thin Films on Amorphous Substrates"; IEEE, 1992; pp. 301–304.

Timothy E. Glassman et al.; "Evidence for Cooperative Oxidation of MoCVD Precursors Used in $Ba_xSr_{1-x} TiO_3$ Film Growth"; Mat. Res. Soc. Symp. Proc. vol. 446, 1997 Materials Research Society; pp. 321–326.

S.N. Subbarao et al.; "Monolithic PiN Photodetector and FET Amplifier on GaAs–os–Si"; IEEE; GaAs IC Symposium–163–166; 1989.

T.A. Langdo et al.; "High Quality Ge on Si by Epitaxial Necking"; Applied Physics Letters; vol. 76, No. 25; pp. 3700–3702; Jun. 19, 2000.

Chenning Hu et al.; Solar Cells From Basics to Advanced Systems; McGraw–Hill Book Company; 1983.

O.J. Painter et al; "Room Temperature Photonic Crystal Defect Lasers at Near–Infrared Wavelengths in inGaAsp"; Journal of Lightwave Technology, vol. 17, No. 11; Nov. 1999.

C. Donn et al.; "A 16–Element, K–Band Monolithic Active Receive Phased Array Antenna"; Antennas and Propagation Society International Symposium, 1988; pp. 188–191, vol. 1; Jun. 6–10, 1988.

Don W. Shaw; "Epitaxial GaAs on Sl: Progress and Potential Applications"; Mat. Res. Soc. Symp. Proc.; pp. 15–30; 1987.

G.J.M. Dormans, et al.; "$PbTiO/_3$ Thin Films Grown by Organometallic Chemical Vapour Deposition"; Third International Symposium on Integrated Ferroelectrics; Apr. 3–5, 1991 (Abstract).

P.J. Borrelli et al.; "Compositional and Structural Properties of Sputtered PLZT Thin Films"; Ferroelectric Thin Films II Symposium; Dec. 2–4, 1991 (Abstract).

Ranu Nayak et al; "Enhanced acousto–optic diffraction efficiency in a symmetric SrRiO3/BaTiO3/SrTiO3 thin–film heterostructure"; Nov. 1, 2000; vol. 39, No. 31; Applied Optics; pp. 5847–5853.

Ranu Nayak et al; "Studies on acousto–optical interaction in SrTiO3/BaTiO3/SrTiO3 epitaxial thin film heterostructures"; J. Phys. D: Appl. Phys. 32 (1999) 280–387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358–367.

V. Kaushik et al.; "Device Characteristics of Crystalline Epitaxial Oxides on Silicon"; Device Research Conference, 2000; Conference Digest 58th DRC; pp. 17–20; Jun. 19–21, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chedlak et al; "Integration of GaAs/Sl with Buffer Layers and Its Impact on Device Integration"; TICS 4, Prof. Sands. MSE 225, Apr. 12, 2002; pp. 1–5.

S.A. Chambers et al.; "Band Discontinuities at Epitaxial SrTiO3/Si(001) Heterojunctions"; Applied Physics Letters; vol. 77, No. 11; Sep. 11, 2000; pp. 1662–1664.

H. Wang et al.; "GaAs/GaAlAs Power HBTs for Mobile Communications"; Microwave Symposium Digest; 1993 IEEE; vol. 2.; pp. 549–562.

Y. Ota et al.; "Application of Heterojunction FET to Power Amplifier for Cellular Telephone"; Electronics Letters; May 26, 1994; vol. 30, No. 11; pp. 906–907.

Keiichi Sakuno et al; "A 3.5W HBT MMIC Power Amplifier Module for Mobile Communications"; IEEE 1994; Microwave and Millimeter–Wave Monolithic Circuits Symposium; pp. 63–66.

Mitsubishi Semiconductors Press Release (GaAs FET's) Nov. 8, 1999 pp. 1–2.

R.J. Matyi et al; "Selected Area Heteroepitaxial Growth of GaAs on Silicon for Advanced Device Structures"; 2194 Thin Solid Films; 181 (1989) Dec. 10; No. 1; pp. 213–225.

K. Nashimolo et al; "Patterning of Nb, LaOnZr, TiO3 Waveguides for Fabricating Micro–Optics Using Wet Etching and Solid–Phase Epitaxy"; Applied Physics Letters; vol. 75, No. 8; Aug. 23, 1999; pp. 1054–1056.

Bang–Hung Tsao et al; "Sputtered Barium Titanate and Barium Strontium Titanate Films for Capacitor Applications"; Applications of Ferroelectrics 2000; Proceedings of the 2000 12th International Symposium on vol. 2; pp. 837–840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room–Temperature Ferromagnetism in Transparent Transition Metal–Doped Titanium Dioxide"; Science; Feb. 2, 2001; vol. 291; pp. 854–858.

S.A. Chambers et al.; "Epitaxial Growth and Properties of Ferromagnetic Co–Doped TiO2 Anatase"; Applied Physics Letters; vol. 79, No. 21; Nov. 19, 2002; pp. 3467–3469.

Charles Kittel: "Introduction to Solid State Physics"; John Wiley & Sons, Inc. Fifth Edition; pp. 416.

Chyuan–Wei Chen et al.; "Liquid–phase epitaxial growth and characterization of InGaAsP layers grown on GaAsP substrates for application to orange light–emitting diodes"; 931 Journal of Applied Physics; 77 (1995) Jan. 15, No. 2; Woodbury, NY, US; pp. 905–909.

W. Zhu et al.; "Oriented diamond files grown on nickel substrates"; 320 Applied Physics Letters; 63(1993) Sep., No. 12, Woodbury, NY, US; pp. 1640–1642.

M. Schreck et al. : "Diamond/Ir/SrTiO3: A material combination for improved heteroepitaxial diamond films"; Applied Physics Letters: vol. 74, No. 5; Feb. 1, 1999; pp. 650–652.

Yoshihiro Yokata et al. ; "Cathodoluminescence of boron–doped heteroepitaxial diamond films on platinum"; Diamond and Related Materials 8(1999) ; pp. 1587–1591.

J.R. Busch et al. : "Linear Electro–Optic Response In Sol–Gel PZT Planar Wavegide" : Electronic Letters: Aug. 13, 1992; vol. 28, No. 17; pp. 1591–1592.

R. Drooped et al: "Epitaxial Oxide Films on Silicon: Growth, Modeling and Device Properties" ; Mat. Res. Soc. Symp. Proc. vol. 519; 2000 Materials Research Society; pp. 155–165.

H. Ohkubo et al. : "Fabrication of High Quality Perovskite Oxide Films by Lateral Epitaxy Verified with RHEED Oscillation" ; 2419A Int. Conf. on Solid State Devices & Materials, Tsukuba, Aug. 26–28 (1992); pp. 457–459.

Lin Li: "Ferroelectric/Superconductor Heterostructures" ; Materials Science and Engineering; 29 (2000) pp. 153–181.

I. Fan et al.; "Dynaamic Beam Switching of Vertical–Cavity Surface–Emitting Lasers with Integrated Optical Beam Routers"; IEEE Photonics Technology Letters; vol. 9, No. 4; Apr. 4, 1997; pp. 505–507.

Y. O. Xu. et al.: "(Mn, Sb) dropped–Pb(Zr,Ti)03 infrared detector arrays" ; Journal of Applied Physics; vol. 88, No. 2; Jul. 15, 2000; pp. 1004–1007.

Kiyoko Kato et al. ; "Reduction of dislocations in InGaAs layer on GaAs using epitaxial lateral overgrowth" ; 2300 Journal of Crystal Growth 115 (1991) pp. 174–179; Dec. 1991.

* cited by examiner

METHOD FOR FABRICATING A SEMICONDUCTOR STRUCTURE INCLUDING A METAL OXIDE INTERFACE WITH SILICON

FIELD OF INVENTION

The present invention relates in general to a method for fabricating a semiconductor structure including a silicate interface between a silicon substrate and monocrystalline metal oxides, and more particularly to a method for fabricating an interface including a seed layer utilizing atomic layer deposition or atomic layer epitaxy.

BACKGROUND OF THE INVENTION

A stable silicon (Si) surface is most desirable for subsequent epitaxial growth of metal oxide thin films on silicon for numerous device applications, e.g., ferroelectrics or high dielectric constant oxides for non-volatile high density memory and next generation MOS devices. It is pivotal to establish a stable transition layer on the Si surface for the subsequent growth of monocrystalline high-k metal oxides.

Some reported growth of these oxides, such as BaO and $BaTiO_3$ on Si(100) were based on a $BaSi_2$ (cubic) template by depositing one fourth monolayer of Ba on Si(100) using molecular beam epitaxy at temperatures greater than 850° C. See for example: R. McKee et al., *Appl. Phys. Lett.* 59(7), pp. 782–784 (Aug. 12, 1991); R. McKee et al., *Appl. Phys. Lett.* 63(20), pp. 2818–2820 (Nov. 15, 1993); R. McKee et al., *Mat. Res. Soc. Symp. Proc.*, Vol. 21, pp. 131–135 (1991); U.S. Pat. No. 5,225,031, issued Jul. 6, 1993, entitled "PROCESS FOR DEPOSITING AN OXIDE EPITAXIALLY ONTO A SILICON SUBSTRATE AND STRUCTURES PREPARED WITH THE PROCESS"; and U.S. Pat. No. 5,482,003, issued Jan. 9, 1996, entitled "PROCESS FOR DEPOSITING EPITAXIAL ALKALINE EARTH OXIDE ONTO A SUBSTRATE AND STRUCTURES PREPARED WITH THE PROCESS". A strontium silicide ($SrSi_2$) interface model with a c(4×2) structure was proposed. See for example: R. McKee et al., *Phys. Rev. Lett.* 81(14), 3014 (Oct. 5, 1998). However, atomic level simulation of this proposed structure indicates that it likely is not stable at elevated temperatures.

Growth of $SrTiO_3$ on silicon (100) using an SrO buffer layer has been accomplished. See for example: T. Tambo et al., *Jpn. J. Appl. Phys.*, Vol. 37 (1998), pp. 4454–4459. However, the SrO buffer layer was thick (100 Å), thereby limiting application for transistor films, and crystallinity was not maintained throughout the growth.

Furthermore, $SrTiO_3$ has been grown on silicon using thick oxide layers (60–120 Å) of SrO or $TiO_x$. See for example: B. K. Moon et al., *Jpn. J. Appl. Phys.*, Vol. 33 (1994), pp. 1472–1477. These thick buffer layers would limit the application for transistors.

Monocrystalline high-k oxides are of great importance for the next generation MOSFET applications. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry. Typically, in all of these known structures, they are prepared using molecular beam epitaxy (MBE), pulsed laser deposition (PLD), sputtering, and/or metal-organic chemical vapor deposition (MOCVD). In these types of methods of preparation, it is difficult to control the silicon oxide interface to achieve low density of interfacial traps, low leakage current, and for thickness and composition uniformity over large areas, such as 8" and above, and conformity over trenches. Accordingly, there is a need for a method that provides for a better interface between a silicon substrate and the metal oxide layer, that is conducive to the nucleation of a monocrystalline metal oxide layer, simple to manufacture, controllable, has suppressed fringing effects in MOSFET devices, and suitable for mass production.

Accordingly, it is a purpose of the present invention to provide for a method of fabricating a thin, monocrystalline stable silicate interface with silicon which would allow for the nucleation of a monocrystalline metal oxide layer on silicon.

It is yet another purpose of the present invention to provide for a method of fabricating a semiconductor structure including a monocrystalline metal oxide interface with silicon that is reliable and amenable to high throughput manufacturing.

SUMMARY OF THE INVENTION

The above problems and others are at least partially solved and the above purposes and others are realized in a method of fabricating a semiconductor structure including the steps of providing a silicon substrate having a surface, forming on the surface of the silicon substrate, by atomic layer deposition (ALD), a seed layer comprising a silicate material and forming, by atomic layer deposition (ALD) one or more layers of a monocrystalline high dielectric constant oxide on the seed layer.

DETAILED DESCRIPTION OF THE PREFERRED EMBODIMENT

A method of fabricating a high dielectric constant (high-k) metal oxide comprises an interface with a silicon substrate and is based on the use of atomic layer deposition (ALD) to form a stable silicate seed layer necessary for the subsequent growth of monocrystalline alkaline-earth metal oxide layers. Accordingly, disclosed is a new method of growing a seed layer and metal oxide layer utilizing atomic layer deposition.

To form the novel interface between a silicon (Si) substrate and one or more layers of a high dielectric constant (high-k) metal oxide, two specific approaches utilizing atomic layer deposition may be used dependent upon the substrate. A first example will be provided for starting with a Si substrate having silicon dioxide ($SiO_2$) formed on the surface. The silicon dioxide is formed as a native oxide, or by utilizing thermal, or chemical techniques. $SiO_2$ is amorphous rather than single crystalline and it is desirable for purposes of growing the seed layer material on the substrate to create the interfacial layer. The second example will be provided for starting with a Si substrate which undergoes hydrogen (H) passivation, thereby having formed on the surface a layer of hydrogen (H).

Figure 1:
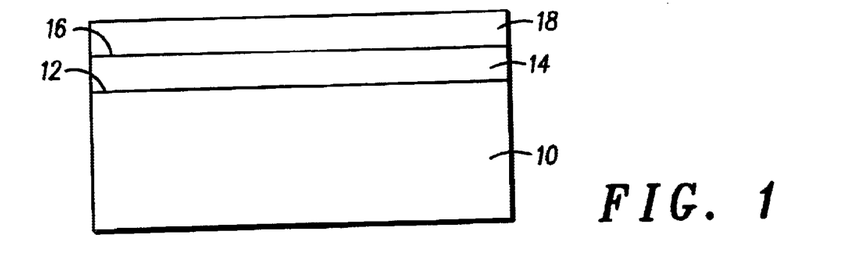
FIG. 1 illustrates a cross-sectional view of a first embodiment of a clean semiconductor substrate having a plurality of oxide layers formed thereon and in accordance with the present invention.

Turning now to the drawings in which like elements are designated with like numbers throughout the FIGs., FIG. 1 illustrates a Si substrate 10 having a surface 12, and a layer 14 of $SiO_2$ thereupon. In this particular embodiment, layer 14 of $SiO_2$ naturally exists (native oxide) once the silicon substrate 10 is exposed to air (oxygen). Alternatively, layer 14 of $SiO_2$ may be formed purposely in a controlled fashion well known in the art, e.g., thermally by applying oxygen onto the surface 12 at a high temperature, or chemically using a standard chemical etch process. Layer 14 is formed with a thickness in a range of 5–100 Å thick, and more particularly with a thickness in a range of 10–25 Å. A novel seed layer (discussed presently) is formed utilizing atomic layer deposition. First, a thin layer, less than 20 Å, of a metal oxide 18, such as zirconium oxide ($ZrO_2$), hafnium oxide ($HfO_2$), strontium oxide ($SrO_2$), or the like, is deposited onto surface 16 of layer 14 of $SiO_2$ using chloride or a β-Diketonate precursor and oxygen ($O_2$), water ($H_2O$), nitrous oxide ($N_2O$), or nitric oxide (NO) at a relatively low temperature, such as less than 600° C. More particularly, Si substrate 10 and the amorphous $SiO_2$ layer 14 are heated to a temperature below the sublimation temperature of the $SiO_2$ layer 14, generally below 900° C., and in a preferred embodiment below 600° C. prior to the deposition of metal oxide 18.

Figure 2:
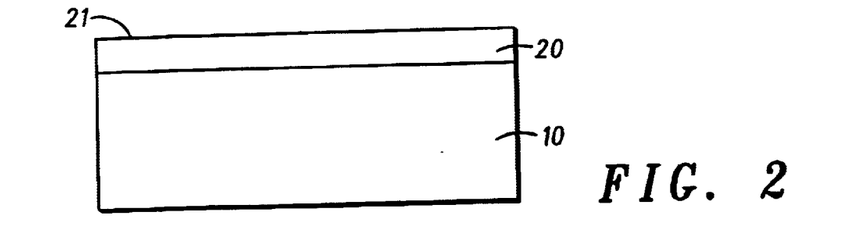
FIG. 2 illustrates a cross-sectional view of a semiconductor substrate having an interface seed layer formed of a silicate layer utilizing atomic layer deposition in accordance with the present invention.

Next, the temperature of substrate 10 is then raised above 600° C. in order for the layer 18 metal oxide ($MO_x$) and the layer 14 of $SiO_2$ to react to form a monocrystalline seed layer 20 of $MSiO_x$ (silicate), as illustrated in FIG. 2.

This step provides for the formation of a stable silicate on the silicon substrate, more particularly the formation of monocrystalline seed layer 20 having a crystal structure which will allow for the nucleation of monocrystalline metal oxide layers. The thickness of silicate, or seed, layer 20 is approximately a few monolayers, more specifically in the range of 1–50 Å, with a preferred thickness in the range of 3–20 Å. In this particular embodiment, the application of metal oxide 18 to the surface 16 of layer 14 and subsequent flushing with nitrogen ($N_2$), argon (Ar), or helium (He), and heating causes a chemical reaction, forming hafnium silicon oxide ($HfSiO_4$), zirconium silicon oxide ($ZrSiO_4$), strontium silicon oxide ($SrSiO_4$), or the like, as seed layer 20. Monitoring of the semiconductor structure can be accomplished utilizing any surface sensitive technique, such as reflection difference spectroscopy, spectroscopic ellipsometry, or the like wherein the surface is monitored by in situ techniques.

It should be understood by those skilled in the art that the temperatures given for these processes are recommended for the particular embodiment described, but the invention is not limited to a particular temperature or pressure range.

Figure 3:
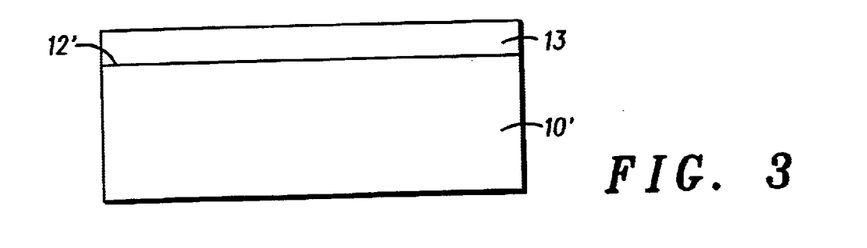
FIG. 3 illustrates a cross-sectional view of second embodiment of a clean semiconductor structure having a hydrogen layer formed thereon and in accordance with the present invention.
Figure 4:
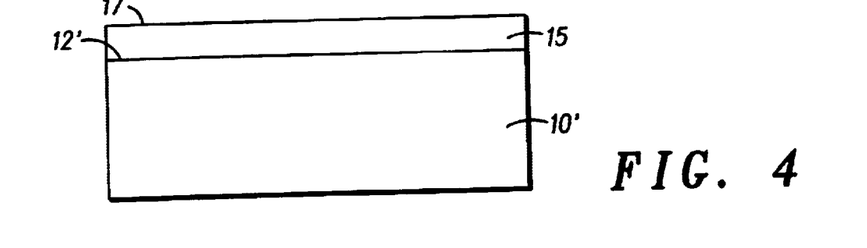
FIG. 4 illustrates a cross-sectional view of a semiconductor structure having an oxide layer formed thereon and in accordance with the present invention.
Figure 5:
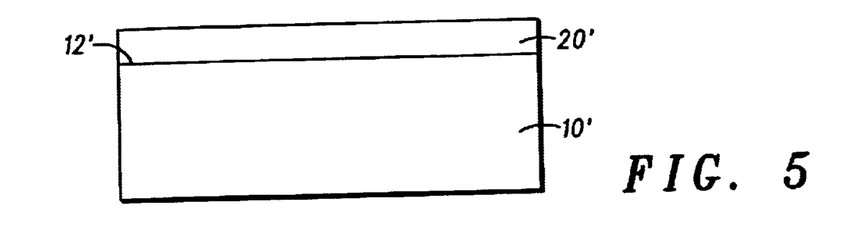
FIG. 5 illustrates a cross-sectional view of a semiconductor substrate having an interface seed layer formed of a silicate layer utilizing atomic layer deposition in accordance with the present invention.

In an alternative embodiment, and as illustrated in FIGS. 3–6, disclosed is Si substrate 10' having a surface 12', having undergone hydrogen (H) passivation, thereby having a layer 13 of hydrogen (H) formed thereon. It should be noted that all components of FIGS. 1 and 2 that are similar to components of the FIGS. 3–5, are designated with similar numbers, having a single prime added to indicate the different embodiment. In this particular embodiment, layer 13 of hydrogen (H) is formed in a controlled fashion by hydrogen passivation techniques.

Figure 6:
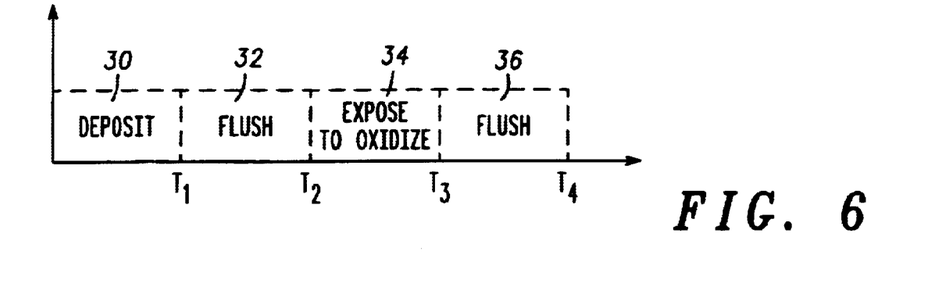
FIG. 6 illustrates the method of forming the interface seed layer utilizing atomic layer deposition in accordance with the present invention.

A novel seed layer (discussed presently) is formed utilizing atomic layer deposition. First, layer 13 of hydrogen (H) is desorbed from surface 12' at a high temperature, preferably in excess of 300° C. Next, surface 12' of the Si substrate 10' is exposed to a Si precursor, such as silane ($SiH_4$), disilane ($SiH_6$), or the like, and a metal precursor, such as hafnium (Hf), strontium (Sr), zirconium (Zr), or the like, generally referenced 15 of FIG. 4, during a time equal to T1, as shown in FIG. 6, referenced 30. Substrate 10' is exposed to the precursors at a temperature of generally between 100° C.–500°, and in a preferred embodiment at a temperature of 250° C. and at an atmospheric pressure of 0.5 mTorr. Once the precursors are deposited, a surface 17 is flushed 32 with an inert gas, such as argon (Ar), nitrogen ($N_2$), or helium (He), for a time, T2, as illustrated in FIGS. 4 and 6 to remove any excess material. The stack is then exposed 34 to oxygen (O) with or without plasma, water ($H_2O$), nitrous oxide ($N_2O$), or nitric oxide (NO) for a time, T3, to oxidize layer 15 of Si and metal, thereby forming seed layer 20', generally similar to seed layer 20 of FIG. 2. Finally, seed layer 20' is flushed 36, as illustrated in FIG. 6, with argon (Ar), nitrogen ($N_2$) or helium (He) to eliminate any excess oxygen (O).

This step provides for the formation of a stable silicate on the silicon substrate which has been hydrogen passivated, more particularly the formation of monocrystalline seed layer 20' having a crystal structure which enables the nucleation of monocrystalline metal oxide layers. The thickness of seed layer 20' is approximately a few monolayers, more specifically in the range of 1–50 Å, with a preferred thickness in the range of 3–20 Å. In this particular embodiment, the atomic layer deposition is repeated for a few cycles, preferably 4–5 cycles, to form a few monolayers. Thus, a chemical reaction takes place forming hafnium silicon oxide ($HfSiO_4$), zirconium silicon oxide ($ZrSiO_4$), strontium silicon oxide ($SrSiO_4$), or the like, as the seed layer 20'.

It should be understood that the component (x), where x=0 to 1 in layer 20', having the composition of $M_xSi_{1-x}O$, can be adjusted using precursor flows of metal and silicon mixed prior to the introduction in the reaction chamber for better control. More particularly, a graded composition could be used whereby, the resultant final layer deposition using ALD renders a solely metal oxide layer, containing no silicon and having a monocrystalline surface with a known crystal structure.

Figure 7:
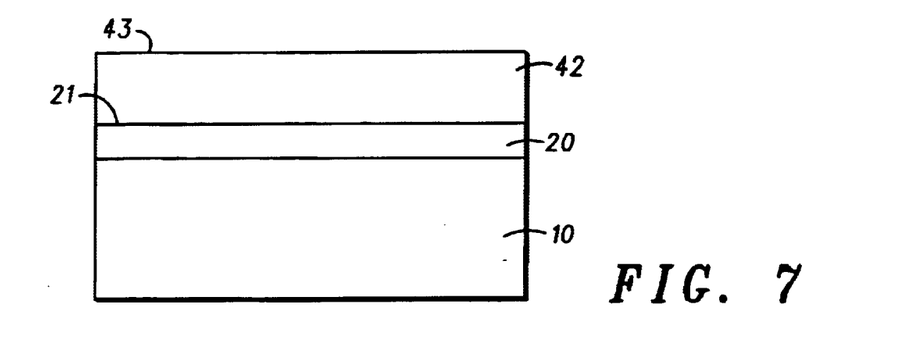
FIG. 7 illustrates a cross-sectional view of a semiconductor substrate having a high dielectric constant metal oxide layer formed on the structure illustrated in FIGS. 2 and 5 utilizing atomic layer deposition in accordance with the present invention.
Figure 8:
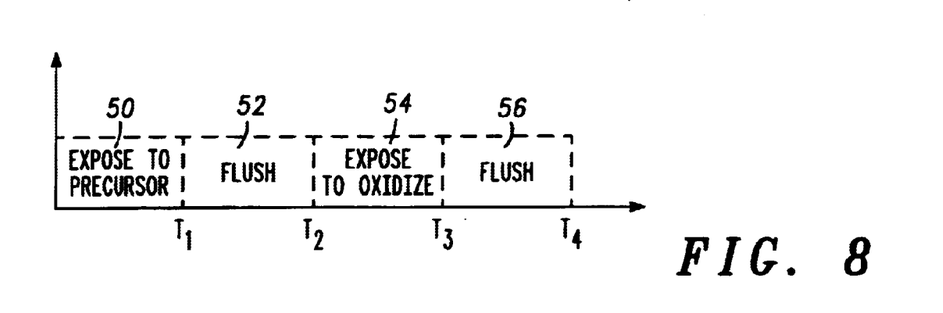
FIG. 8 illustrates the method of forming the high dielectric constant metal oxide layer utilizing atomic layer deposition in accordance with the present invention.
Figure 9:
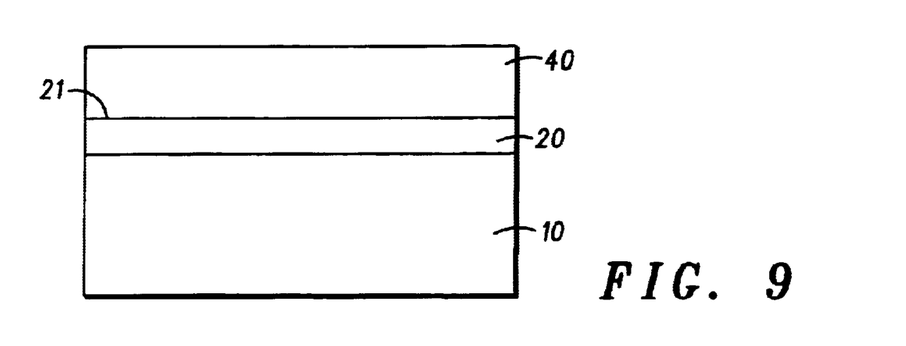
FIG. 9 illustrates a cross-sectional view of a semiconductor substrate having a monocrystalline high-k metal oxide layer formed on the structure illustrated in FIGS. 2 and 5 utilizing atomic layer deposition in accordance with the present invention.

Referring now to FIGS. 7, 8, and 9, the formation of monocrystalline high dielectric constant oxide layer 40 is accomplished by atomic layer deposition. First, seed layer 20 is exposed 50 to a metal precursor, such as hafnium (Hf), strontium (Sr), zirconium (Zr), lanthanum (La), aluminum (Al), yttrium (Y), titanium (Ti), barium (Ba), lanthanum scandium (LaSc), or the like, during a time, T1, thereby forming a layer 42 on surface 21 of seed layer 20. Seed layer 20 is exposed 50 to the metal precursors at a temperature of generally between 100° C.–500°, and in a preferred embodiment at a temperature of 250° C. and at an atmospheric pressure of 0.5 mTorr. A surface 43, of layer 42 is next flushed 52 with an inert gas, such as argon (Ar), nitrogen (N2) or helium (He) for a time, T2, to remove any excess metal precursor. Finally, the semiconductor structure is exposed 54 to oxygen ($O_2$) with or without plasma, water ($H_2O$), nitrous oxide ($N_2O$), or nitric oxide (NO) for a time, T3, to oxidize layer 42, more particularly the metal precursor, forming monocrystalline high-k metal oxide layer 40, as illustrated in FIG. 9. It is disclosed that high-k metal oxide layer 40 thus includes at least one of a high dielectric constant oxide selected from the group of hafnium oxide ($HfO_2$), zirconium oxide ($ZrO_2$), strontium titanate ($SrTiO_3$), lanthanum oxide ($La_2O_3$), yttrium oxide ($Y_2O_3$), titanium oxide ($TiO_2$), barium titanate ($BaTiO_3$), lanthanum aluminate ($LaAlO_3$), lanthanum scandium oxide ($LaScO_3$) and aluminum oxide ($Al_2O_3$).

As a final step, layer 40 is flushed 56 with argon (Ar), nitrogen ($N_2$), helium (He) or the like, to remove any excess oxygen. This atomic layer deposition is repeated for a given number of cycles to form to form a monocrystalline high-k oxide of a desired thickness.

Accordingly, disclosed is a method for fabricating a thin, seed layer 20 with silicon 10 as been described herein using atomic layer deposition (ALD). This forcing of the formation of a monocrystalline silicate layer by atomic layer deposition provides for high precision control of the thickness and composition over large areas. In addition, conformity of growth in trenches is achieved. In each cycle of the deposition process, the migration of species is enhanced on the surface.

What is claimed is:

1. A method of fabricating a semiconductor structure comprising:

providing a silicon substrate having a surface;

forming by atomic layer deposition a monocrystalline seed layer on the surface of the silicon substrate, the seed layer formed of a silicate material; and forming by atomic layer deposition one or more layers of a monocrystalline high dielectric constant oxide on the seed layer, wherein forming by atomic layer deposition the seed layer of a silicate material includes forming the seed layer of a silicate material selected from the group of strontium silicon oxide ($SrSiO_4$), zirconium silicon oxide ($ZrSiO_4$), and hafnium silicon oxide ($HfSiO_4$), wherein forming by atomic layer deposition one or more layers of a monocrystalline high dielectric constant oxide on the seed layer includes forming the layer of high dielectric constant oxide selected from the group of hafnium oxide ($HfO_2$), zirconium oxide ($ZrO_2$), strontium titanate ($SrTiO_3$), lanthanum oxide ($La_2O_3$), yttrium oxide ($Y_2O_3$), titanium oxide ($TiO_2$), barium titanate ($BaTiO_3$), lanthanum aluminate ($LaAlO_3$), lanthanum scandium oxide ($LaScO_3$) and aluminum oxide ($Al_2O_3$), wherein providing a substrate includes providing a substrate having formed thereon a silicon oxide, and wherein forming by atomic layer deposition a monocrystalline seed layer further includes depositing a layer of a metal oxide onto a surface of the silicon oxide, flushing the layer of metal oxide with an inert gas, reacting the metal oxide with the silicon oxide to form the silicate selected from the group of strontium silicon oxide ($SrSiO_4$), zirconium silicon oxide ($ZrSiO_4$), and hafnium silicon oxide ($HfSiO_4$).

2. A method of fabricating a semiconductor structure comprising:

providing a silicon substrate having a surface;

forming by atomic layer deposition a monocrystalline seed layer on the surface of the silicon substrate, the seed layer formed of a silicate material; and forming by atomic layer deposition one or more layers of a monocrystalline high dielectric constant oxide on the seed layer, wherein forming by atomic layer deposition the seed layer of a silicate material includes forming the seed layer of a silicate material selected from the group of strontium silicon oxide ($SrSiO_4$), zirconium silicon oxide ($ZrSiO_4$), and hafnium silicon oxide ($HfSiO_4$), wherein forming by atomic layer deposition one or more layers of a monocrystalline high dielectric constant oxide on the seed layer includes forming the layer of high dielectric constant oxide selected from the group of hafnium oxide ($HfO_2$), zirconium oxide ($ZrO_2$), strontium titanate ($SrTiO_3$), lanthanum oxide ($La_2O_3$), yttrium oxide ($Y_2O_3$), titanium oxide ($TiO_2$), barium titanate ($BaTiO_3$), lanthanum aluminate ($LaAlO_3$), lanthanum scandium oxide ($LaScO_3$) and aluminum oxide ($Al_2O_3$), wherein providing a substrate includes providing a substrate having a layer of hydrogen formed thereon by hydrogen passivation.

3. A method of fabricating a semiconductor structure as claimed in claim 2 wherein forming by atomic layer deposition a seed layer further includes desorbing the layer of hydrogen formed on the substrate, exposing the silicon substrate to a silicon precursor and at least one metal precursor forming a layer of a silicon and a metal on the surface of the silicon substrate, flushing the layer of silicon with an inert gas to remove any excess silicon and metal precursor material, exposing the surface of the layer of silicon to at least one of oxygen ($O_2$) with or without plasma, water ($H_2O$), nitrous oxide ($N_2O$), or nitric oxide (NO) to oxidize the layer of silicon and metal thereby forming a single oxidized monolayer, and flushing the oxidized monolayer with an inert gas.

4. A method of fabricating a semiconductor structure as claimed in claim 3 further including repeating the atomic layer deposition to form oxidized monolayers.

5. A method of fabricating a semiconductor structure comprising:

providing a silicon substrate having a surface;

forming by atomic layer deposition a monocrystalline seed layer on the surface of the silicon substrate, the seed layer formed of a silicate material; and forming by atomic layer deposition one or more layers of a monocrystalline high dielectric constant oxide on the seed layer, wherein forming by atomic layer deposition the seed layer of a silicate material includes forming the seed layer of a silicate material selected from the group of strontium silicon oxide ($SrSiO_4$), zirconium silicon oxide ($ZrSiO_4$), and hafnium silicon oxide ($HfSiO_4$), wherein forming by atomic layer deposition one or more layers of a monocrystalline high dielectric constant oxide on the seed layer includes forming the layer of high dielectric constant oxide selected from the group of hafnium oxide ($HfO_2$), zirconium oxide ($ZrO_2$), strontium titanate ($SrTiO_3$), lanthanum oxide ($La_2O_3$), yttrium oxide ($Y_2O_3$), titanium oxide ($TiO_2$), barium titanate ($BaTiO_3$), lanthanum aluminate ($LaAlO_3$), lanthanum scandium oxide ($LaScO_3$) and aluminum oxide ($Al_2O_3$), whereby the forming by atomic layer deposition one or more layers of a monocrystalline high dielectric constant oxide includes exposing the monocrystalline seed layer to a metal precursor, thereby forming a layer of metal, flushing the layer of metal with an inert gas, exposing the layer of metal to at least one of oxygen (O) with or without plasma, water ($H_2O$), nitrous oxide ($N_2O$), or nitric oxide (NO) to oxidize the layer of metal thereby forming a single monocrystalline high-k oxidized monolayer, and flushing the oxidized monolayer with an inert gas.

6. A method of fabricating a semiconductor structure as claimed in claim 5 further including repeating the atomic layer deposition to form monocrystalline high-k oxide of a desired thickness.

\* \* \* \* \*